United States Patent
Fugate et al.

(10) Patent No.: US 7,466,783 B2
(45) Date of Patent: Dec. 16, 2008

(54) METHOD AND SYSTEM TO IMPLEMENT A DOUBLE DATA RATE (DDR) INTERFACE

(75) Inventors: Earl L. Fugate, Lexington, KY (US); Jason K. Young, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 583 days.

(21) Appl. No.: 11/010,678

(22) Filed: Dec. 13, 2004

(65) Prior Publication Data

US 2006/0126769 A1 Jun. 15, 2006

(51) Int. Cl.
H04L 7/02 (2006.01)
(52) U.S. Cl. .......................................... 375/360; 326/46
(58) Field of Classification Search .................. 375/360
See application file for complete search history.

(56) References Cited

U.S. PATENT DOCUMENTS

| | | | |
|---|---|---|---|
| 5,418,485 A * | 5/1995 | Duret et al. ................ | 327/172 |
| 6,100,733 A | 8/2000 | Dortu et al. | |
| 6,215,710 B1 | 4/2001 | Han et al. | |
| 6,240,042 B1 | 5/2001 | Li | |
| 6,282,132 B1 | 8/2001 | Brown et al. | |
| 6,396,322 B1 | 5/2002 | Kim et al. | |
| 6,442,102 B1 | 8/2002 | Borkenhagen et al. | |
| 6,525,565 B2 * | 2/2003 | Young et al. ................ | 326/46 |
| 6,538,956 B2 | 3/2003 | Ryu et al. | |
| 6,621,760 B1 | 9/2003 | Ahmad et al. | |
| 6,625,241 B2 | 9/2003 | Mejia | |
| 6,757,212 B2 | 6/2004 | Hamamoto et al. | |
| 6,791,889 B2 | 9/2004 | Peterson | |
| 2002/0003748 A1 | 1/2002 | Fujita et al. | |
| 2002/0071334 A1 | 6/2002 | Azim | |
| 2002/0147898 A1 * | 10/2002 | Rentschler et al. ........... | 711/170 |
| 2003/0042941 A1 | 3/2003 | Wang et al. | |
| 2004/0103226 A1 | 5/2004 | Johnson et al. | |
| 2004/0145962 A1 | 7/2004 | Heo et al. | |
| 2004/0151053 A1 | 8/2004 | Peterson | |
| 2004/0160833 A1 | 8/2004 | Suzuki | |
| 2004/0163006 A1 | 8/2004 | Rosen | |
| 2004/0174765 A1 | 9/2004 | Seo et al. | |

OTHER PUBLICATIONS

Massoud Pedram, Qing Wu, Xunwei Wu, "A New Design for Double Edge Triggered Flip-flops," Proceedings of the Asia and South Pacific Design Automation Conference, Feb. 1998, pp. 417-421.

* cited by examiner

Primary Examiner—Shuwang Liu
Assistant Examiner—Michael R Neff
(74) Attorney, Agent, or Firm—Michael Best & Friedrich, LLP

(57) ABSTRACT

Embodiments of the invention relate to a method and system to implement a DDR interface, such as a high-speed encode/decode interface. In one embodiment, a method of encoding data comprises the acts of (1) receiving a first signal, a second signal, and a first clock signal common to the first and second signals; (2) detecting rising edges and falling edges of the first clock signal; and (3) generating a composite signal based at least in part on the first and second signals and the detected rising and falling edges. The composite signal is associated with a second clock signal that is generated based at least in part on the detected rising and falling edges and on a time delay relative to the first clock signal.

20 Claims, 7 Drawing Sheets

METHOD AND SYSTEM TO IMPLEMENT A DOUBLE DATA RATE (DDR) INTERFACE

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

Embodiments of the invention relate generally to data communications. More specifically, embodiments of the invention relate to a method and system to implement a high-speed double data rate interface.

BACKGROUND OF THE INVENTION

Double data rate (DDR) interfaces encode multiple input data streams onto a single channel for transmission. Such interfaces achieve double the data throughput and avoid the need for dedicated channels over which to carry each of the respective input data streams. However, existing DDR interfaces are based on underlying methodologies that are not sufficiently robust or economical to exploit the full potential of DDR. For instance, existing interfaces employ a separate strobe signal for alignment of a data stream, or multiple transmission frequencies to multiplex multiple data streams onto a single data stream.

SUMMARY OF THE INVENTION

The following summary sets forth certain embodiments of the invention described in greater detail below. It does not set forth all such embodiments and should in no way be construed as limiting of the invention.

Embodiments of the invention relate to a method and system to implement a DDR interface, such as a high-speed encode/decode interface. In one embodiment, a method of encoding data comprises the acts of (1) receiving a first signal, a second signal, and a first clock signal common to the first and second signals; (2) detecting rising edges and falling edges of the first clock signal; and (3) generating a composite signal based at least in part on the first and second signals and the detected rising and falling edges. The composite signal is associated with a second clock signal that is generated based at least in part on the detected rising and falling edges and on a time delay relative to the first clock signal. The method also may include the act of generating the second clock signal.

In another embodiment, a system to encode data comprises a detection circuit and a composite signal generator circuit. The detection circuit is configured to detect rising edges and falling edges of a first clock signal common to a first signal and a second signal. The composite signal generator circuit is configured to generate a composite signal based at least in part on the first and second signals and the detected rising and falling edges. The composite signal is associated with a second clock signal that is generated based at least in part on the detected rising and falling edges and on a time delay relative to the first clock signal. The system also may include a clock generator circuit that is configured to generate the second clock signal.

DETAILED DESCRIPTION OF EXEMPLARY EMBODIMENTS OF THE INVENTION

Figure 1:
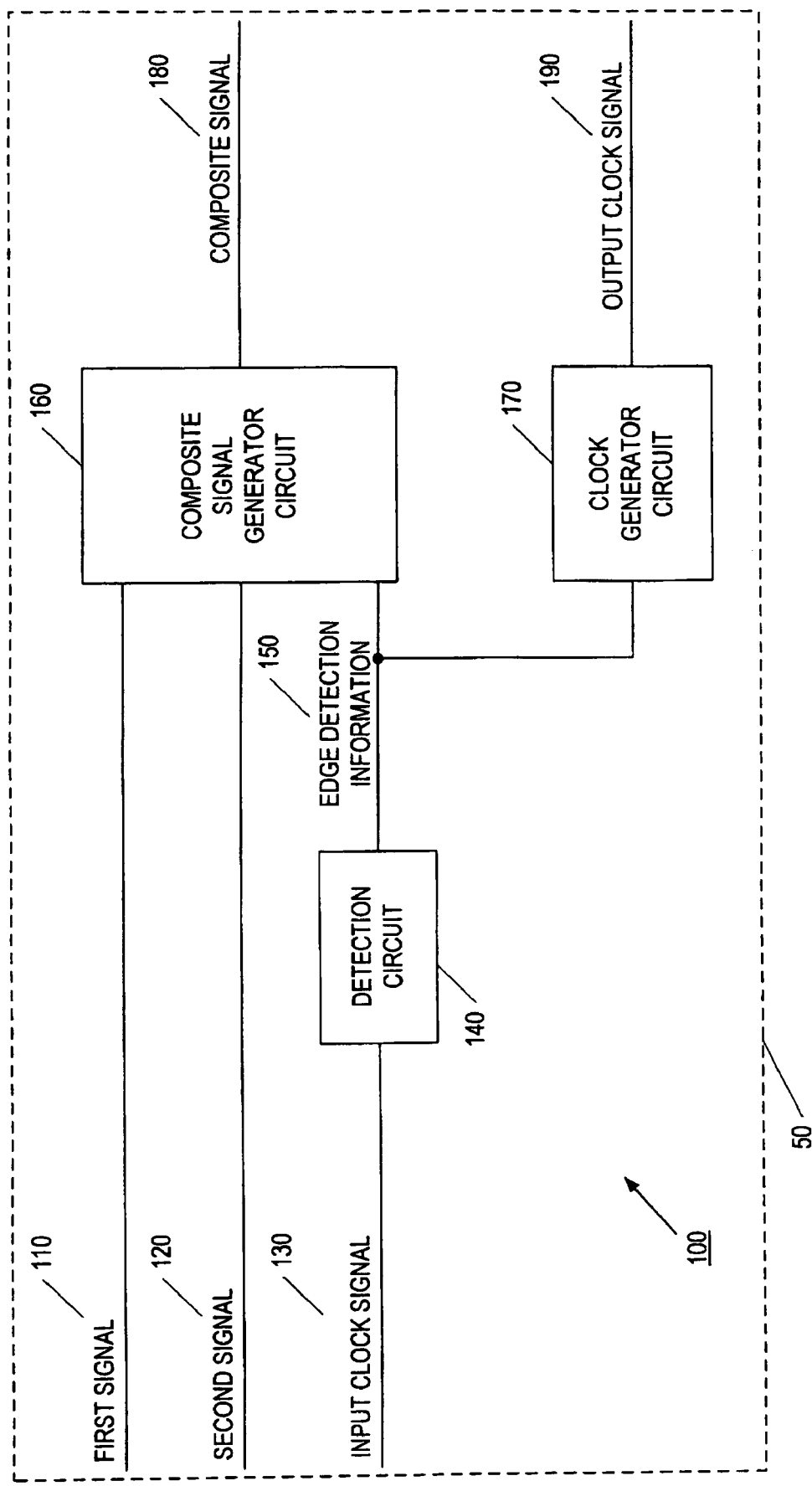
FIG. 1 shows a printer including a DDR interface system according to an embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. The order of limitations specified in any method claims does not imply that the steps or acts set forth therein must be performed in that order, unless an order is explicitly identified in the specification as essential. In addition, it should be noted that a plurality of hardware and software based devices may be utilized to implement the invention.

Embodiments of the invention relate to a method and system for a high-speed double data rate (DDR) interface. In an embodiment, a first and a second input signal are encoded into one composite signal. The input signals are associated with an input clock signal, and the composite signal is associated with an output clock signal that is a time-delayed version of the input clock signal.

In a specific embodiment, the input signals are encoded as follows. Respective values of the first and second input signals are determined at the rising edges of the input clock signal. If the first input signal is active on a rising edge of the input clock signal, then the composite signal is active on the corresponding rising edge of the output clock signal. If the second input signal is active on a rising edge of the input clock signal, then the composite signal is active on the corresponding falling edge of the output clock signal. In other words, in the composite signal, the values of the first input signal are encoded with the rising edges of the output clock signal, and the values of the second input signal are encoded with the falling edges of the output clock signal.

Although certain embodiments herein involve input data streams that are clocked on the rising edges of the input clock signal, it is to be understood that other implementations can involve input data streams that are clocked on the falling edges of the input clock signal.

Embodiments of the invention can be applied in various contexts, such as memory interfaces or input/output (I/O) interfaces, such as those related to printers, copiers, scanners, facsimile devices, and combination or multifunction printers that perform some or all these functions. These devices are hereinafter collectively referred to as "printer" or "printer system." In addition, embodiments can be applied to other devices, such as computers or other electronic devices, that transmit or process multiple data streams, as well as to computers that communicate over one or more networks. It is to be appreciated that the embodiments described herein achieve a reduction in total I/O pin count and can significantly reduce manufacturing costs. In addition, increased data throughput and/or decreased power dissipation can be achieved. In an embodiment of the invention involving an interface between electronics of a printer and a consumable for use with the printer, such benefits can be particularly advantageous.

FIG. 1 shows a printer 50 including a DDR interface system 100 according to an embodiment of the invention. The system 100 involves a first input signal 110 and a second input signal 120 that are to be encoded in one composite signal 180. The first and second signals 110, 120 are data streams in the printer system 50. The first and second signals 110, 120 are synchronized with respect to the input clock signal 130, which is a common clock signal generated as known in the art. The system 100 includes a detection circuit 140, a composite signal generator circuit 160, and a clock generator circuit 170. The circuitry shown in FIG. 1 and in subsequent figures can be implemented in various ways, such as via an ASIC (application-specific integrated circuit), or by coupling appropriate analog and/or digital components to yield one or more apparatuses.

The detection circuit 140 detects rising edges and falling edges of the input clock signal 130 and outputs edge detection information 150. The detection circuit 140 may employ analog and/or digital modules as understood in the art.

The composite signal generator circuit 160 receives the first and second signals 110, 120 and the edge detection information 150 as inputs. Based on these inputs, the composite signal generator circuit 160 generates a composite signal 180. In an embodiment, the composite signal generator circuit 160 uses the edge detection information 150 to determine whether the first signal 110 is active on a rising edge of the input clock signal 130, and whether the second signal 120 is active on a rising edge of the input clock signal 130. If the first signal 110 is active on the rising edge of the input clock signal 130, then the composite signal 180 outputted by the composite signal generator circuit 160 is active on a corresponding rising edge of the output clock signal 190. If the second signal 120 is active on the rising edge of the input clock signal 130, then the composite signal 180 outputted by the composite signal generator circuit 160 is active on a corresponding falling edge of the output clock signal 190.

The clock generator circuit 170 receives the edge detection information 150 as an input and outputs the output clock signal 190. The output clock signal 190 is a time-delayed version of the input clock signal 130 and has the same frequency as the input clock signal 190. The composite signal 180 encodes the first and second signals 110, 120 respectively on the rising and falling edges of the output clock signal 190. In other words, the composite signal 180 is self-aligned with respect to the output clock signal 190, with the first signal 110 being encoded in the composite signal 180 on the rising edges of the output clock signal 190, and the second signal 120 being encoded in the composite signal 180 on the falling edges of the output clock signal 190.

It is to be appreciated that the clock generator circuit 170 need not be included in the system 100. In an example sequence of events, the system 100 produces the composite signal 180, which is then transmitted to one or more other modules. The output clock signal 190 can be generated later for use, for example, in a decoding process.

Figure 2:
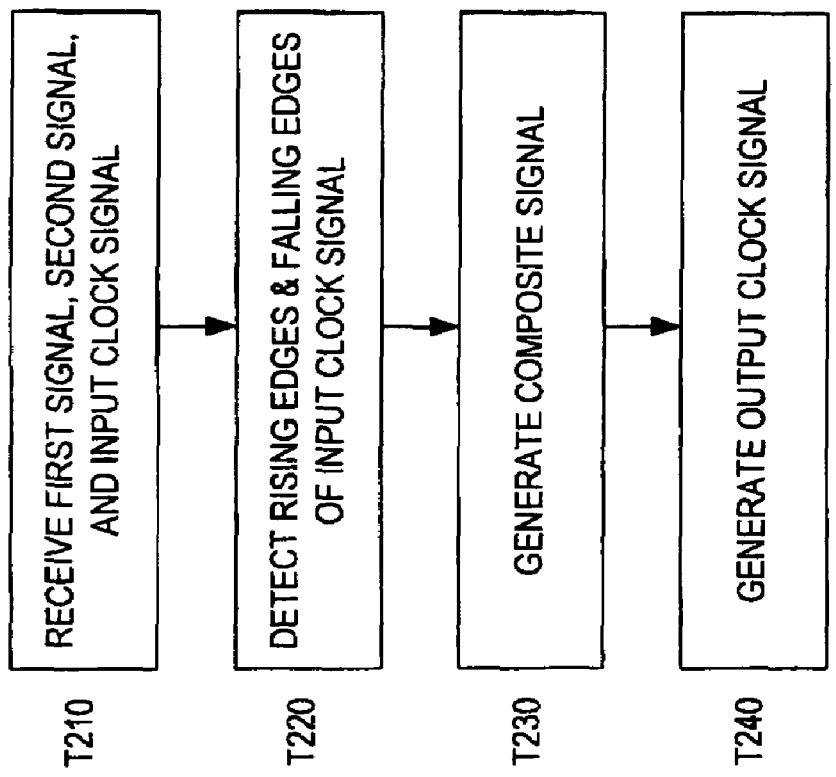
FIG. 2 shows a DDR encoding process according to an embodiment of the invention.

FIG. 2 shows a DDR encoding process 200 according to an embodiment of the invention. The process 200 may be employed by a system such as the system 100 of FIG. 1, for example. Task T210 receives a first signal, a second signal, and an input clock signal common to the first and second signals. Task T220 detects rising edges and falling edges of the input clock signal. Task T230 generates a composite signal that encodes the first and second signals. Task T240 generates an output clock signal associated with the composite signal.

Figure 3:
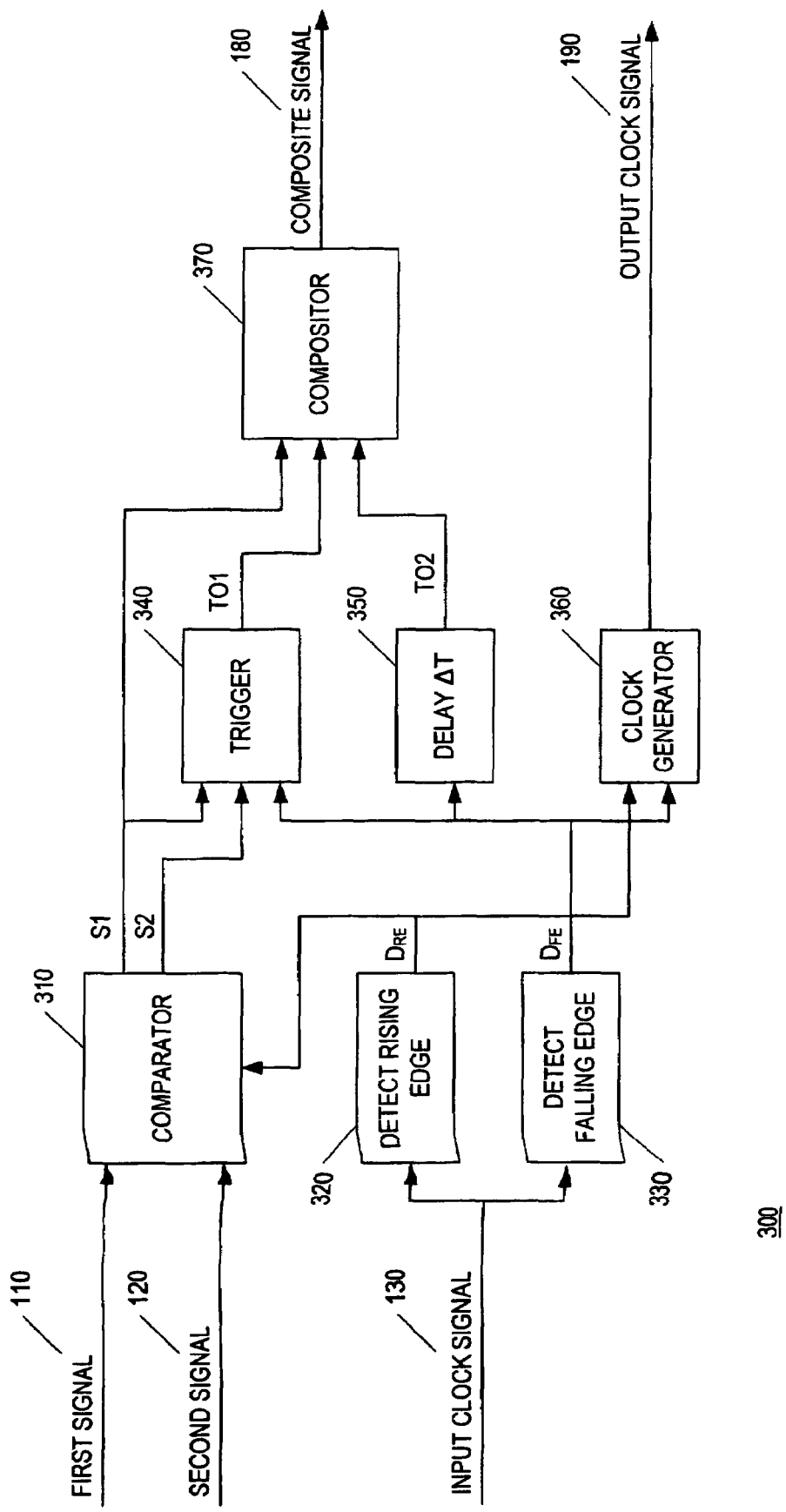
FIG. 3 shows a DDR interface system according to an embodiment of the invention.

FIG. 3 shows a DDR interface system 300 according to an embodiment of the invention. The system 300 is one example implementation of the system 100 of FIG. 1 and can be implemented using various analog or digital components (e.g., logic gates) in accordance with the art. The system 300 can be implemented, for example, in a printer or printer system. The system 300 includes a comparator block 310, a detect rising edge block 320, a detect falling edge block 330, a trigger block 340, a delay block 350, a clock generator block 360, and a compositor block 370. The first and second signals 110, 120 and input clock signal 130 shown in FIG. 3 are related as described above in connection with FIG. 1. Additionally, the respective values of the first and second signals 110, 120 on the rising edges of the input clock signal 130 are encoded respectively in the composite signal 180 on the rising and falling edges of the output clock signal 190.

The detect rising edge block 320 and detect falling edge block 330 each receive the input clock signal 130 as an input. The output $D_{RE}$ of the detect rising edge block 320 becomes active upon detection of a rising edge of the input clock signal 130. The output $D_{FE}$ of the detect falling edge block 330 becomes active upon detection of a falling edge of the input clock signal 130.

The clock generator block 360 receives as inputs the output $D_{RE}$ of the detect rising edge block 320 and the output $D_{FE}$ of the detect falling edge block 330. The clock generator block 360 applies an internal delay $\Delta_{clk}$ and outputs the output clock signal 190, which is a time-delayed version of the input clock signal 130. The delay $\Delta_{clk}$ allows for the self-alignment of the composite signal 180 (further described below). In an example implementation, $\Delta_{clk}$ is between approximately 30 and 40 nanoseconds; however, as can be appreciated by one of ordinary skill in the art, other time delays, including those that are both shorter and longer, can be used (e.g., where the time delay can be based on, for example, the respective application, technology process, etc).

In an example analog implementation, the clock generator block 360 employs analog circuitry, such as skew detection circuitry whose design is based on known rising and falling times of the outputs of the detect rising edge and detect falling edge blocks 320, 330. Trip points can be set to generate a clock signal based on those outputs, and one or more buffers can be utilized to introduce a desired delay in the clock signal to produce the output clock signal 190. In an example digital implementation, the clock generator block 360 employs filtering through cascaded buffers, with the filter design being based on known propagation characteristics of the outputs of the detect rising edge and detect falling edge blocks 320, 330.

The comparator block 310 determines if an input signal needs to be encoded as active in the composite signal 180 upon the rising edge or the falling edge of the output clock signal 190. Specifically, the comparator block 310 receives as inputs the first signal 110, the second signal 120, and the output $D_{RE}$ of the detect rising edge block 320. The outputs S1 and S2 of the comparator block 310 are logic states. The comparator block 310 respectively compares the first and second signals 110, 120 with $D_{RE}$. At each rising edge of the input clock signal 130 (i.e., $D_{RE}$ is active), the output S1 becomes active only if the first signal 110 is active, and the output S2 becomes active only if the second signal 120 is active. In other words, an active output S1 at the rising edge of the input clock signal 130 indicates that the composite signal 180 needs to be active at a corresponding rising edge of the output clock signal 190. Similarly, an active output S2 at the rising edge of the input clock signal 130 indicates that the composite signal 180 needs to be active at a corresponding falling edge of the output clock signal 190.

The trigger block 340, delay block 350, and compositor block 370 contain interrelated circuitry (described below), including delays and logic, that ensures correctness of the values of the composite signal 180 on the rising and falling edges of the output clock signal 190. For instance, if the output S1 is high and the output S2 is low at the rising edge of the input clock signal 130, then the trigger block 340 output, which needs initially to be high for the corresponding rising edge of the output clock signal 190, needs to be shut off midstream to ensure that the composite signal 190 is low at the falling edge of the output clock signal 190. Conversely, if S1 is low and S2 is high at the rising edge of the input clock signal 130, then the composite signal 190 must be driven high from its initial low condition by the time the corresponding falling edge of the output clock signal 190 is reached.

Specifically, the trigger block 340 receives as input the signals S1, S2, and $D_{FE}$ and outputs the signal TO1. The logic employed within the trigger block 340 is as follows:

Output TO1=$(S1 \oplus S2)D_{FE}$

Thus, the output signal TO1 becomes active only when either, but not both, S1 or S2 is active and a falling edge of the input clock signal 130 has been detected ($D_{FE}$ is active). The trigger block 340 has an internal delay. In an example implementation, the delay $\Delta T_{TO1}$ for output TO1 is designed to be the difference of the time delay of the clock generator block 360 and 20 nanoseconds. That is, $\Delta T_{TO1}=\Delta T_{clk}-20$ ns.

The delay block 350 receives as input $D_{FE}$ and outputs the signal TO2, which is a delayed indication of a detected falling edge of the input clock signal 130. The delay block 350 produces a delay $\Delta T$ for output TO2. In an example implementation, the delay $\Delta T$ for output TO2 is designed to be the sum of the time delay of the clock generator block and 20 nanoseconds. That is, $\Delta T=\Delta T_{clk}+20$ ns. If desired, the delay block 350 can be implemented using similar circuitry to that described above for the clock generator block 360.

The compositor block 370 receives as inputs the signals S1, TO1, and T02. The compositor block 370 includes an internal state (not shown) with logic as follows:

Internal State=S1⊕TO1

Therefore, the internal state is active when either, but not both, S1 or TO1 is active. In other words, the internal state is active (1) when the first signal 110 is active on a rising edge of the input clock signal 130, or (exclusive or) (2) when either, but not both, S1 or S2 is active and a falling edge of the input clock signal 130 has been detected. The logic in the compositor block 370 to generate the composite signal 180 is as follows:

Composite Out=InternalState(!TO2)

That is, the composite signal 180 is active when the internal state is active and a falling edge has not been detected.

Figure 4:
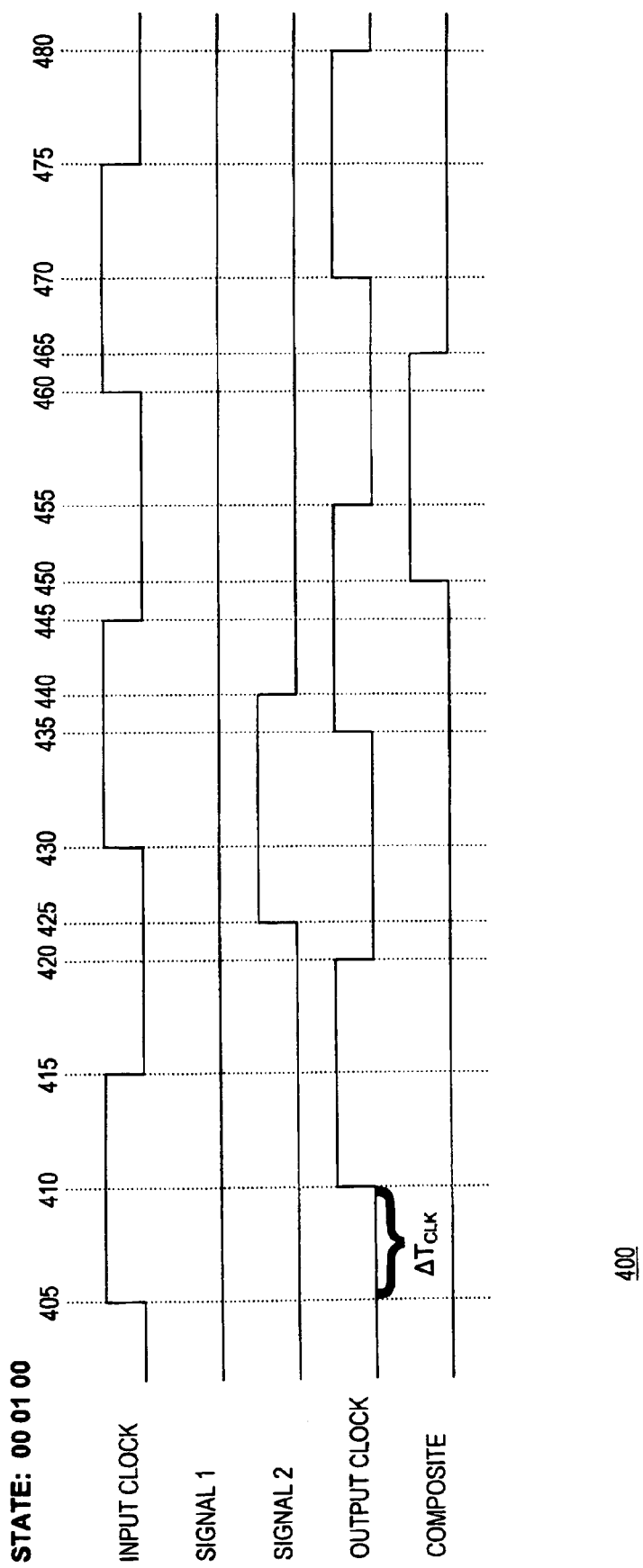
FIG. 4 shows a timing diagram for DDR encoding of example input signals according to an embodiment of the invention.

FIG. 4 shows a timing diagram 400 for DDR encoding of example input signals according to an embodiment of the invention. The timing diagram 400 shows waveforms for an input clock, a first signal, a second signal, an output clock, and a composite signal. The timing diagram 400 is associated with a DDR interface system such as, for example, the systems 100, 300 respectively shown in FIGS. 1 and 3 above. In FIG. 4, certain instances in time t are represented with dotted vertical lines and labeled with reference numerals 405 to 480. The states described below may respectively correspond to the logic levels S1 and S2 of the comparator block 310 of FIG. 3.

The input clock is a square wave common to signal 1 and signal 2. Signal 1 and signal 2 are clocked on the rising edges of the input clock. The output clock is a time-delayed copy of the original input clock, being delayed by $\Delta T_{clk}$.

At t=405, the first rising edge of the input clock, the state is 00 (i.e., signal 1 is low, and signal 2 is low). At t=410, the first rising edge of the output clock, the composite signal is low, signifying that signal 1 was low at t=405. At t=420, the first falling edge of the output clock, the composite signal is low, signifying that signal 2 was low at t=405.

At t=430, the next rising edge of the input clock, the state is 01 (signal 1 is low, signal 2 is high). At t=435, the next rising edge of the output clock, the composite signal is low, signifying that signal 1 was low at t=430. At t=455, the next falling edge of the output clock, the composite signal is high, signifying that signal 2 was high at t=430.

At t=460, the next rising edge of the input clock, the state is 00. At T=470, the next rising edge of the output clock, the composite signal is low, signifying that signal 1 was low at t=460. At t=480, the next falling edge of the output clock, the composite signal is low, signifying that signal 2 was low at t=460.

Figure 5:
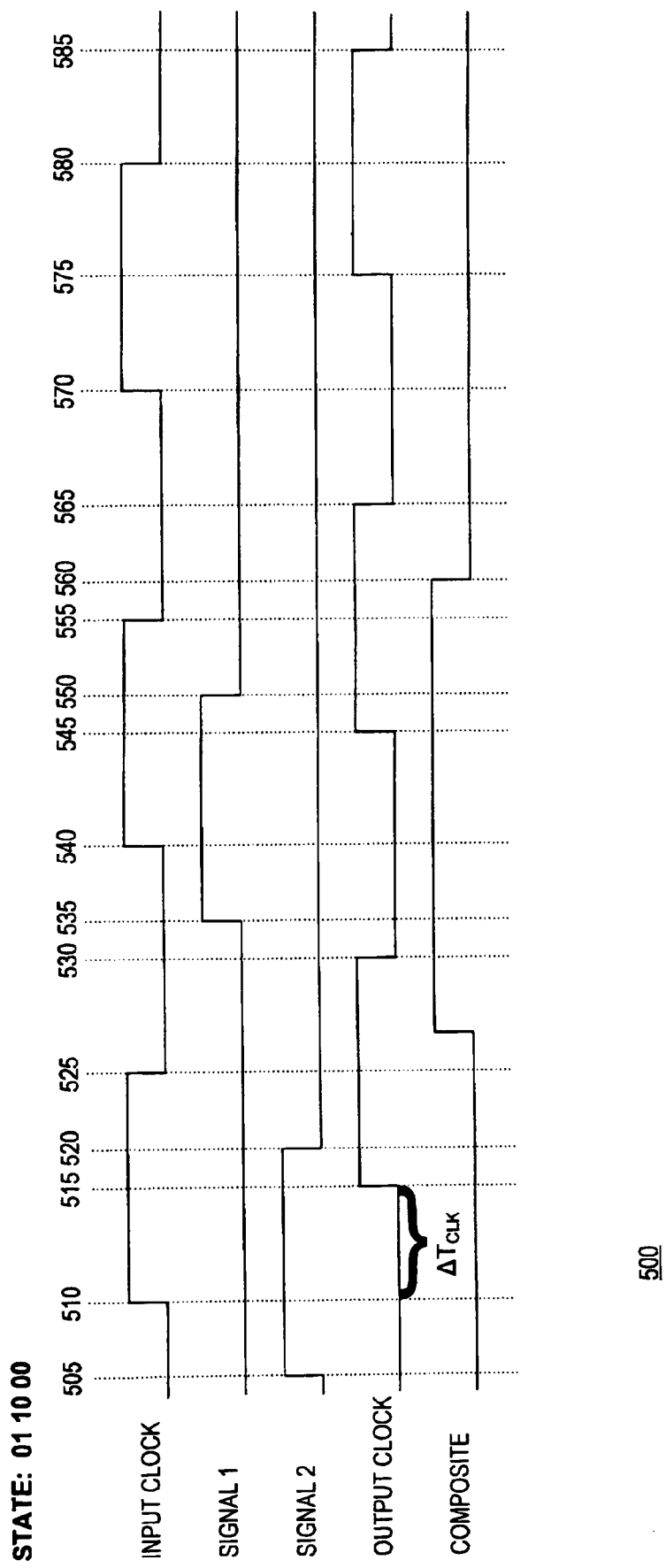
FIG. 5 shows a timing diagram for DDR encoding of example input signals according to an embodiment of the invention.

FIG. 5 shows a timing diagram 500 for DDR encoding of example input signals according to an embodiment of the invention. The timing diagram 500 shows waveforms for an input clock, a first signal, a second signal, an output clock, and a composite signal. The timing diagram 500 is associated with a DDR interface system such as, for example, the systems 100, 300 respectively shown in FIGS. 1 and 3 above. In FIG. 5, certain instances in time t are represented with dotted vertical lines and labelled with reference numerals 505 to 585. The states described below may respectively correspond to the logic levels S1 and S2 of the comparator block 310 of FIG. 3.

The input clock is a square wave common to signal 1 and signal 2. Signal 1 and signal 2 are clocked on the rising edges of the input clock. The output clock is a time-delayed copy of the original input clock, being delayed by $\Delta T_{clk}$.

At t=510, the first rising edge of the input clock, the state is 01. At T=515, the first rising edge of the output clock, the composite signal is low, signifying that signal 1 was low at t=510. At t=530, the first falling edge of the output clock, the composite signal is high, signifying that signal 2 was high at t=510.

At t=540, the next rising edge of the input clock, the state is 10 (signal 1 is high, signal 2 is low). At t=545, the next rising edge of the output clock, the composite signal is high, signifying that signal 1 was high at t=540. At t=565, the next falling edge of the output clock, the composite signal is low, signifying that signal 2 was low at t=540.

At t=570, the next rising edge of the input clock, the state is 00. At t=575, the next rising edge of the output clock, the composite signal is low, signifying that signal 1 was low at t=570. At t=585, the next falling edge of the output clock, the composite signal is low, signifying that signal 2 was low at t=570.

Figure 6:
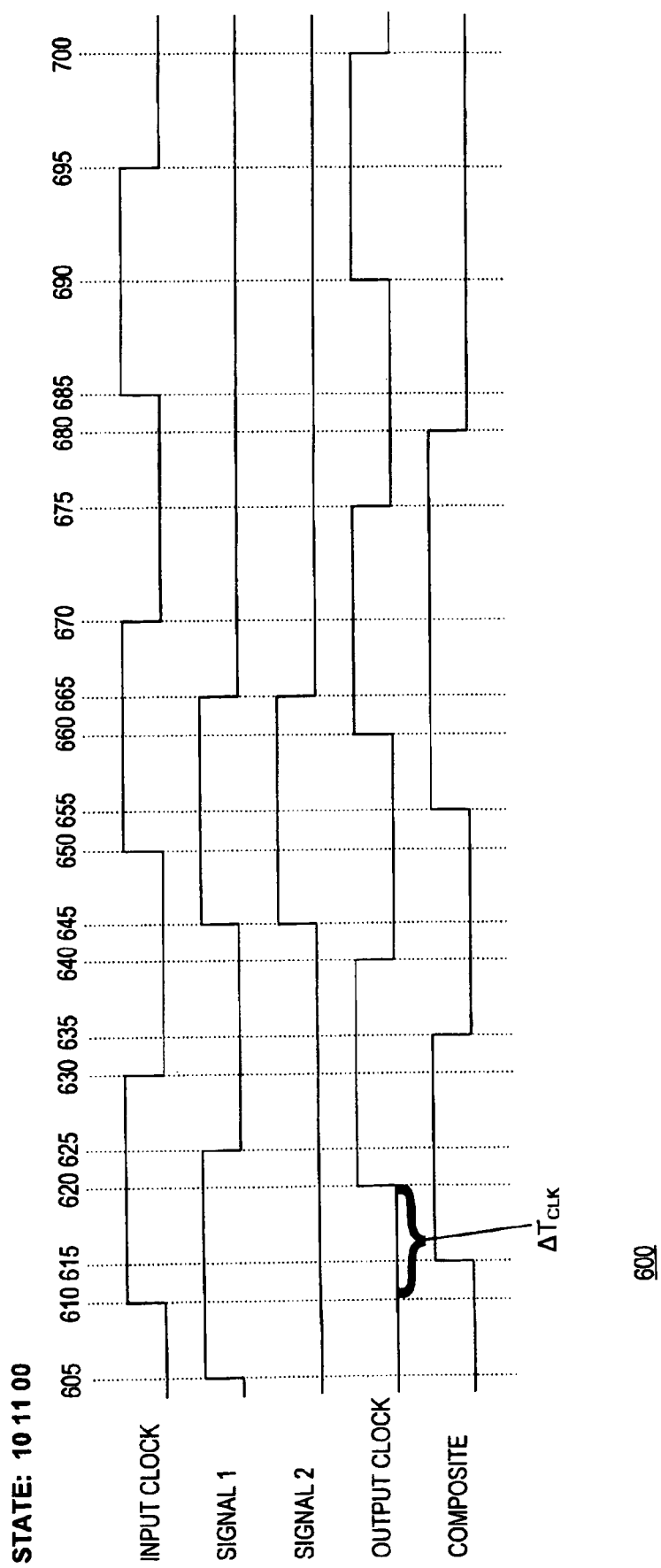
FIG. 6 shows a timing diagram for DDR encoding of example input signals according to an embodiment of the invention.
Figure 7:
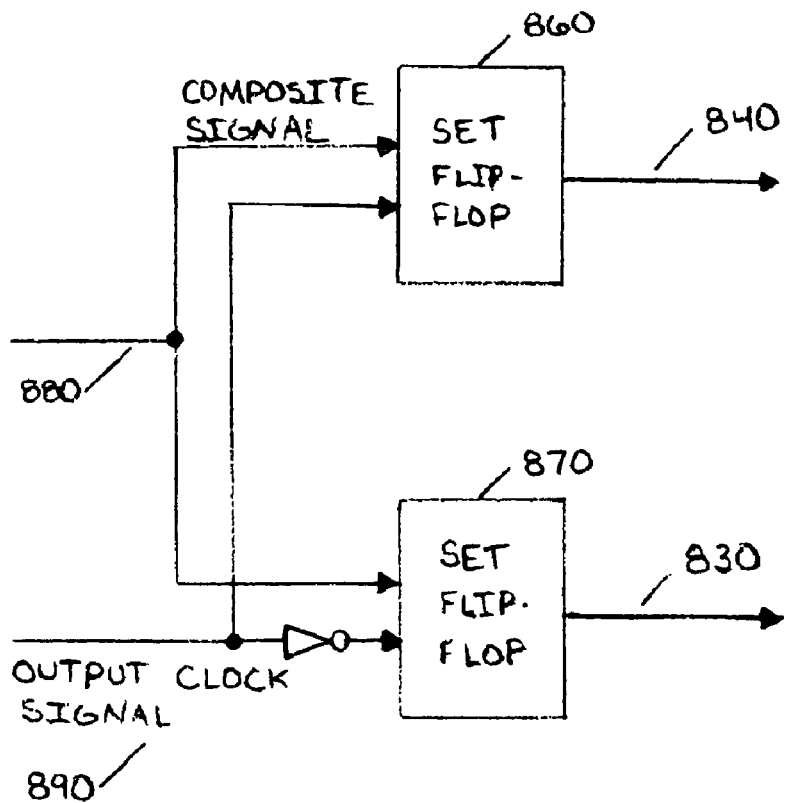
FIG. 7 shows a DDR decoding system according an embodiment of the invention.

FIG. 6 shows a timing diagram 600 for DDR encoding of example input signals according to an embodiment of the invention. The timing diagram 600 shows waveforms for an input clock, a first signal, a second signal, an output clock, and a composite signal. The timing diagram 600 is associated with a DDR interface system such as, for example, the systems 100, 300 respectively shown in FIGS. 1 and 3 above. In FIG. 6, certain instances in time t are represented with dotted vertical lines and labelled with reference numerals 605 to 700. The states described below may respectively correspond to the logic levels S1 and S2 of the comparator block 310 of FIG. 3.

The input clock is a square wave common to signal 1 and signal 2. Signal 1 and signal 2 are clocked on the rising edges of the input clock. The output clock is a time-delayed copy of the original input clock, being delayed by $\Delta T_{clk}$.

At t=610, the first rising edge of the input clock, the state is 10. At t=620, the first rising edge of the output clock, the composite signal is high, signifying that signal 1 was high at t=610. At t=640, the first falling edge of the output clock, the composite signal is low, signifying that signal 2 was low at t=610.

At t=650, the next rising edge of the input clock, the state is 11 (signal 1 is high, signal 2 is high). At t=660, the next rising edge of the output clock, the composite signal is high, signifying that signal 1 was high at t=650. At t=675, the next falling edge of the output clock, the composite signal is high, signifying that signal 2 was high at t=650.

At t=685, the next rising edge of the input clock, the state is 00. At t=690, the next rising edge of the output clock, the composite signal is low, signifying that signal 1 was low at t=685. At t=700, the next falling edge of the output clock, the composite signal is low, signifying that signal 2 was low at t=685.

Accordingly, it can be seen from the above timing diagrams how embodiments of the invention advantageously encode multiple signals in a composite signal. In an embodiment of the invention, an interfacing apparatus/device, such as a consumable of a printer, can receive the composite signal and decode the same to recover data from the multiple encoded signals. In an exemplary embodiment, such as one wherein the interface includes an integrated chip on the consumable, this can be done while advantageously reducing the number of pins needed for the chip (and related circuitry and/or tracings), thereby reducing costs associated with manufacturing the same. In addition, in at least some embodiments, increased data throughput and/or decreased power dissipation can also be achieved.

For example, in an embodiment of the invention wherein a printhead operatively installed in a printer receives (e.g., via bond pads in communication with bumps on a printhead carriage of a printer) a composite signal 880 and an output clock signal 890 (or a clock signal from which the output clock signal can be generated), which have been generated (e.g., by the printer) in a manner similar to one of the embodiments previously discussed previously herein, a circuit such as 800 (which might be part of an integrated chip already installed on the printhead for ejecting droplets of ink) could be used to decode the composite signal for use in operating the printhead (while reducing the number of pins needed for the aforementioned integrated chip, for example). In such an embodiment, circuit 800 might include two single edge-triggered (SET) flip flops 860 and 870 which receive composite signal 880 and output clock signal 890, with one of the two SET flip flops (e.g., flip flop 870) receiving an inverted form of the output clock signal. In this way, composite signal 880 is decoded by flip flop 860 shifting/transferring data 840 on a rising edge of output clock signal 890 and flip flop 870 shifting/transferring data 830 on a falling edge of the clock output signal.

Figure 8:
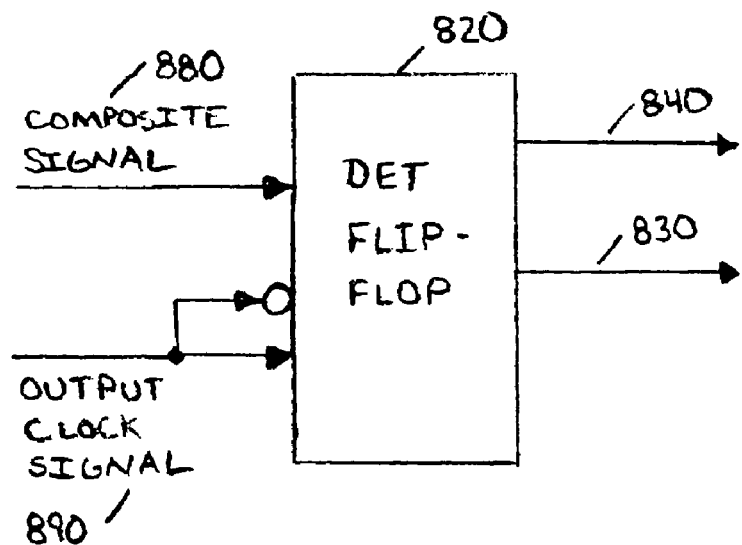
FIG. 8 shows a DDR decoding system according to another embodiment of the invention.

Meanwhile, FIG. 8 depicts another embodiment which might be used to decode composite signal 880. In particular, circuit 810, which includes a single double-edge triggered flip flop 820, could be provided on the integrated chip for decoding composite signal 880. In such an embodiment, DET flip flop 820 shifts/transfers data 830, 840 on both the rising and falling edges of a received clock output signal 880. Exemplary DET flip flop designs can be found, for example, in the article entitled "A New Design for Double Edge Triggered Flip-Flops", by Pedram et al, which was published in the *Proceedings of the Asia and South Pacific Design Automation Conference*, pp. 417-421, on February of 1998.

As should also be apparent to one of ordinary skill in the art, the systems shown in the figures are models of what actual systems might be like. As noted, many of the modules and logical structures described above are capable of being implemented in software executed by a microprocessor or a similar device or of being implemented in hardware using a variety of components including, for example, application specific integrated circuits ("ASICs"). Terms like "processor" may include or refer to both hardware and/or software. Furthermore, where capitalized terms are used in the specification, such terms are used to conform to common practices and to help correlate the description with the coding examples and drawings. However, no specific meaning is implied or should be inferred simply due to the use of capitalization. Thus, the claims should not be limited to the specific examples or terminology or to any specific hardware or software implementation or combination of software or hardware. Various features and advantages of the invention are set forth in the following claims.

What is claimed:

1. A method of encoding data, the method comprising the acts of:

receiving a first signal, a second signal, and a first clock signal common to the first and second signals;

detecting rising edges and falling edges of the first clock signal; and generating a composite signal based at least in part on the first and second signals and the detected rising and falling edges, and wherein the composite signal is associated with a second clock signal that is generated based at least in part on the detected rising and falling edges and delayed by an internal delay $\Delta T_{clk}$ relative to the first clock signal.

2. The method of claim 1, wherein generating the composite signal comprises:

determining whether the first signal is active on a rising edge of the first clock signal; and determining whether the second signal is active on a rising edge of the first clock signal.

3. The method of claim 2, wherein:
if the first signal is active on the rising edge of the first clock signal, the composite signal is active prior to and during a corresponding rising edge of the second clock signal, and
if the second signal is active on the rising edge of the first clock signal, the composite signal is active prior to and during a corresponding falling edge of the second clock signal.

4. The method of claim 1, wherein at least one of the first signal and the second signal is associated with a printer.

5. The method of claim 1, wherein the internal delay $\Delta T_{clk}$ is between approximately 30 nanoseconds and 40 nanoseconds.

6. The method of claim 1, further comprising the act of generating the second clock signal.

7. The method of claim 1, wherein the composite signal is self-aligned with respect to the second clock signal.

8. The method of claim 1, wherein the first and second clock signals have the same frequency.

9. A system to encode data, the system comprising:
a detection circuit configured to detect rising edges and falling edges of a first clock signal common to a first signal and a second signal; and
a composite signal generator circuit configured to generate a composite signal based at least in part on the first and second signals and the detected rising and falling edges, and
wherein the composite signal is associated with a second clock signal that is generated based at least in part on the detected rising and falling edges and delayed by an internal delay $\Delta T_{clk}$ relative to the first clock signal.

10. The system of claim 9, wherein the composite signal generator circuit is configured to:
determine whether the first signal is active on a rising edge of the first clock signal; and
determine whether the second signal is active on a rising edge of the first clock signal.

11. The system of claim 10, wherein the composite signal generator circuit comprises a comparator configured to determine whether at least one of the first signal and the second signal is active on the rising edge of the first clock signal.

12. The system of claim 10, wherein:
if the first signal is active on the rising edge of the first clock signal, the composite signal is active prior to and during a corresponding rising edge of the second clock signal, and
if the second signal is active on the rising edge of the first clock signal, the composite signal is active prior to and during a corresponding falling edge of the second clock signal.

13. A consumable for a printer, wherein the consumable is configured to receive and decode the signal generated by the system of claim 9.

14. The system of claim 9, wherein the internal delay $\Delta T_{clk}$ is between approximately 30 nanoseconds and 40 nanoseconds.

15. The system of claim 9, further comprising a clock generator circuit configured to generate the second clock signal.

16. The system of claim 9, wherein the composite signal is self-aligned with respect to the second clock signal.

17. The system of claim 9, wherein the composite signal generator circuit comprises:
a triggering circuit configured to produce an output responsive to the detected falling edges of the first clock signal and to logic inputs respectively indicating a level of the first and second signals on a rising edge of the first clock signal;
a delay circuit configured to produce an output based at least in part on the detected falling edges of the first clock signal that is delayed by a delay $\Delta T_{TO2}$; and
a compositor circuit coupled to the outputs of the triggering circuit and the delay circuit, the compositor circuit being configured to output the generated composite signal.

18. The system of claim 17, wherein the triggering circuit has a predetermined internal delay $\Delta T_{TO1}$.

19. The system of claim 9, wherein the first and second clock signals have the same frequency.

20. A method of encoding data, the method comprising the acts of:
receiving a first signal, a second signal, and a first clock signal common to the first and second signals;
detecting rising edges and falling edges of the first clock signal;
providing a detected rising edge signal $D_{RE}$ and a detected falling edge signal $D_{FE}$ relative to the detected rising and falling edges of the first clock signal;
determining whether the first and second signals are active on a rising edge of the first clock signal by reading the first and second signals when the detected rising edge signal $D_{RE}$ is present;
providing logic states S1 and S2, wherein S1 is at a logic high when the first signal is active when the detected rising edge signal $D_{RE}$ is present, and S2 is at a logic high when the second signal is active when the detected rising edge signal $D_{RE}$ is present;
generating a composite signal based at least in part on the first and second signals and the detected rising and falling edges, wherein if S1 is at a logic high, the composite signal is active prior to and during a corresponding rising edge of the second clock signal, and if S2 is at a logic high, the composite signal is active prior to and during a corresponding falling edge of the second clock signal; and
wherein the composite signal is associated with a second clock signal that is generated based at least in part on the detected rising and falling edges and delayed by an internal delay $\Delta T_{clk}$ relative to the first clock signal.

* * * * *